US006534234B1

United States Patent
Naruse et al.

(10) Patent No.: US 6,534,234 B1
(45) Date of Patent: *Mar. 18, 2003

(54) PACKAGE OF PHOTOSENSITIVE PLANOGRAPHIC PRINTING PLATES AND PHOTOSENSITIVE PLANOGRAPHIC PRINTING PLATE

(75) Inventors: Yasuhito Naruse, Shizuoka (JP); Takayuki Usui, Shizuoka (JP)

(73) Assignee: Fuji Photo Film Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,183

(22) Filed: Oct. 5, 1998

(30) Foreign Application Priority Data

Oct. 3, 1997 (JP) ............................................. 9-270754

(51) Int. Cl.⁷ ................................................. G03F 7/09
(52) U.S. Cl. .................... 430/162; 430/166; 430/273.1; 430/302; 430/950; 101/130; 101/453; 101/463.1
(58) Field of Search ................................ 430/302, 306, 430/15, 270.1, 950, 322, 323, 273.1; 101/130, 453, 463.1

(56) References Cited

U.S. PATENT DOCUMENTS 3,897,292 A * 7/1975 Fukuyama .................. 156/153
4,336,093 A * 6/1982 Kohayakawa et al. ...... 428/922
4,403,030 A * 9/1983 Miura et al. .............. 430/273.1
4,781,941 A 11/1988 Inukai et al. .................. 427/27
5,464,724 A * 11/1995 Akiyama et al. ........... 430/272
5,496,677 A * 3/1996 Toyama et al. ............. 430/162

FOREIGN PATENT DOCUMENTS

| EP | 0130222 | * 6/1983 | |
| EP | 0 528 395 | 2/1993 | ............. G03F/7/11 |
| JP | 62-52548 | 3/1987 | ............. G03C/1/68 |

OTHER PUBLICATIONS

Patent Abstracts of Japan, vol. 011, No. 243 (p–603), Aug. 8, 1987 for JP 62–052548 A (Fuji Photo Film Co., Ltd.), Mar. 7, 1987.
Patent Abstracts of Japan, vol. 016, No. 046 (p–1307), Feb. 5, 1992 for JP 03–249652 a (Konica Corp. Et al), Nov. 7, 1991.

* cited by examiner

Primary Examiner—Janet Baxter
Assistant Examiner—Yvette C. Thornton
(74) Attorney, Agent, or Firm—Sughrue Mion, PLLC (57) ABSTRACT

A package of photosensitive planographic printing plates which comprises a stack of the photosensitive planographic printing plates between each of which a protection paper is interposed, wherein the coefficient of static friction between the surface of the photosensitive layer of the photosensitive planographic printing plate and the surface of the protection paper is 0.3 or more. In the package, slippage between the photosensitive planographic printing plate and the protection paper and abrasion of the photosensitive layer rarely occur through transport.

7 Claims, 2 Drawing Sheets

PACKAGE OF PHOTOSENSITIVE PLANOGRAPHIC PRINTING PLATES AND PHOTOSENSITIVE PLANOGRAPHIC PRINTING PLATE

BACKGROUND OF THE INVENTION

This invention relates to a package of photosensitive planographic printing plates and a photosensitive planographic printing plate, wherein slippage of the photosensitive planographic printing plate(s) is inhibited.

Heretofore, various techniques have been disclosed with respect to packages of photosensitive planographic printing plates. For example, a technique of packaging photosensitive planographic printing plates wherein a photosensitive planographic printing plate and a protection paper are superposed alternately for the purpose of facilitating cutting of the photosensitive planographic printing plates and protecting the surface of the photosensitive layer from abrasion.

In the case of packaging photosensitive printing plate for planography or letterpress printing using metal plate, such as aluminum, iron or zinc, as the support, a stack of several to tens sheets of the photosensitive printing plate is packaged, in general, as a unit package. In this case, the surface of the photosensitive layer was occasionally damaged by the friction between the photosensitive printing plates in a stacked state. Moreover, a guillotine knife which tends to be damaged upon cutting a stack of tens sheets of the photosensitive printing plate having a metal support without protection paper into a designed size by the guillotine cutter. As a result, the cut face of the photosensitive planographic printing plate did become not a mirror face but a nicked face, and the guillotine knife must be changed.

Therefore, the above technique of packaging photosensitive planographic printing plates with superposing a photosensitive planographic printing plate and a protection paper alternately was developed so as to protect the surface of the photosensitive layer from abrasion and so as not to damage the guillotine knife resulting in the increase of cutting times. The protection paper is softer than the photosensitive layer, and is required to have good adhesiveness to and nevertheless easy separability from the photosensitive printing plate and small frictional electrification, as well as protection of the photosensitive layer and the improvement in cutting ability.

Examples of the protection paper are disclosed in Japanese Patent KOKAI Nos. 55-118041, Japanese Patent KOKOKU No. 61-19025, Japanese Patent KOKAI No. 57-99647 and U.S. Pat. No. 4,403,030 which corresponds to and they were developed for the improvement in the cutting ability, the adhesiveness and the separability.

Incidentally, slippage occasionally occurs in the stack of the photosensitive planographic printing plates and protection papers superposed alternately during transport or the like. However, the problem of the slippage, especially a means for resolving the slippage and abrasion of photosensitive layer simultaneously, was not considered in the above conventional techniques at all, and any effective countermeasure was not known.

SUMMARY OF THE INVENTION

An object of the invention is to provide a package of photosensitive planographic printing plates comprising a stack of the photosensitive planographic printing plates and protection papers superposed alternately, wherein the slippage between the photosensitive planographic printing plate and the protection paper rarely occurs and the abrasion of the surface of the photosensitive layer also rarely occurs.

Another object of the invention is to provide a photosensitive planographic printing plate which is resistant to slip on a protection paper and to abrasion of its photosensitive layer.

The inventors investigated in order to achieve the above objects, and found that it is effective for resolving the above coexisting problems that the coefficient of static friction between the photosensitive planographic printing plate and the protection paper is in a definite value or more.

Thus, the present invention provides a package of photosensitive planographic printing plates which comprises a stack of the photosensitive planographic printing plates between each of which a protection paper is interposed, wherein the coefficient of static friction between the surface of the photosensitive layer of the photosensitive planographic printing plate and the surface of the protection paper is 0.3 or more.

The present invention also provides a package of photosensitive planographic printing plates which comprises a stack of the photosensitive planographic printing plates between each of which a protection paper is interposed, wherein the coefficient of static friction between the surface opposite to the photosensitive layer of the photosensitive planographic printing plate and the surface of the protection paper is 0.3 or more.

The inventors also found that, as a means for resolving the above coexisting problems, it is effective to provide convexes on the surface of the photosensitive layer and to allow the reverse surface to have a definite surface roughness or more.

Thus, the present invention also provides a photosensitive planographic printing plate which comprises the photosensitive layer of which the surface is provided with convexes having a mean height of 2 $\mu$m or more a density of 100 convexes/cm$^2$ or more, and the surface opposite to the photosensitive layer having a mean surface roughness of 0.15 or more.

1 . . . Temperature controlling chamber
2 . . . Wetting apparatus
3 . . . Electrostatic coater
4 . . . Wetting apparatus
5 . . . Drying chamber
6 . . . Aluminum web
7 . . . Roller
11 . . . Coating bar
12 . . . Aluminum web
13 . . . Bar carrier
14 . . . Coating solution
15 . . . Supply port
16 . . . Dam member
17 . . . Guide channel 18 ... Pool of coating solution
21 ... Extrusion coater
22 ... Vacuum chamber
23 ... Exhaust pipe
24 ... Aluminum web
25 ... Backup roller
26 ... Coating solution
31 ... Guide roller
32 ... Aluminum web
33 ... Coating portion
34 ... First step drying zone
35 ... Air inlet
36 ... Exhaust port
37 ... Rectifier plate
38 ... Second step drying zone
39 ... Air inlet
40 ... Exhaust port
41 ... Slit nozzle

DETAILED DESCRIPTION OF THE INVENTION

In the package of the invention, the coefficient of static fiction between the surface of the photosensitive layer of the photosensitive planographic printing plate and the surface of the protection paper and/or between the surface (opposite surface) opposite to the surface of the photosensitive layer of the photosensitive planographic printing plate and the surface of the protection paper is 0.3 or more, preferably 0.5 or more. On the other hand, the coefficient of static friction is preferably 0.9 or less from the practical viewpoint.

The coefficient of static friction between the surface of the photosensitive layer of the photosensitive planographic printing plate and the surface of the protection paper and that between the surface opposite to the surface of the photosensitive layer of the photosensitive planographic printing plate and the surface of the protection paper can be controlled by providing a mat layer, by adjusting surface roughness, by selecting additives and adjusting the blending amount of additives in the photosensitive layer, or the like.

In the case of adjusting the coefficient of static friction by forming a mat layer, the coefficient of static friction greatly varies by the diameter, height and density of the convexes on the surface of the mat layer.

A suitable diameter of the convex of the mat layer is 200 μm or less, preferably 60 μm or less as a mean diameter. When the mean diameter of the convexes exceeds 200 μm, the friction coefficient is too great due to the great contact area of the protection paper with the photosensitive layer. As a result, slipping ability of the protection paper is insufficient on the photosensitive layer, and wrinkles tend to occur upon superposing on the photosensitive layer. On the other hand, the mean diameter of the convexes is preferably 10 μm or more at the minimum from the practical viewpoint. The diameter can be changed by several methods. For example, by increasing the rotation speed of the cup, the diameter of the drop may become smaller. And the size of the mat is roughly proportionate to the size of the drops.

A suitable height of the convex of the mat layer is 2 μm or more, preferably 3 μm or more and 10 μm or less, preferably 8 μm or less as a mean height. When the mean height is less than 2 μm, undercut by exposure occurs caused by insufficient contact condition. On the other hand, the mean height exceeding 10 μm is also undesirable in view of tone reproduction because of difficulty in hairline formation and decrease of highlight dots. The height may be changed by selecting matting agents.

A suitable density of the convexes of the mat layer is 100 convexes/cm$^2$ or more, preferably 700 convexes/cm$^2$ or more. When the convex density is less than 100 convexes/cm$^2$, the friction is small, and accordingly, the surface is slippery. A preferable maximum density of the convexes is convexes/cm$^2$ or less from the practical viewpoint. When rotating cup is used, the convex density may be controlled by the changing the flaw rate of lynel supply.

By forming convexes having a mean height at a rate (density) of 100 convexes/cm$^2$ or more, the coefficient of static friction between the surface of the photosensitive layer and the surface of the protection layer can be made 0.3 or more.

The mat layer is composed of e.g. methyl methacrylate/ethyl acrylate/sodium acrylate copolymer. A suitable higher of the mat is 2 to 10 μm, usually 3 to 7 μm.

The mat layer also functions to shorten evacuating time and to prevent blur or printing, upon contact exposure using a vacuum printing frame.

The mat layer can be formed by the method disclosed in Japanese Patent KOKAI No. 50-125805 or Japanese Patent KOKOKU No. 57-6582 or 61-28986, or the method of melting with heating solid powder disclosed in Japanese Patent KOKOKU No. 62-62337, or the like.

Figure 1:
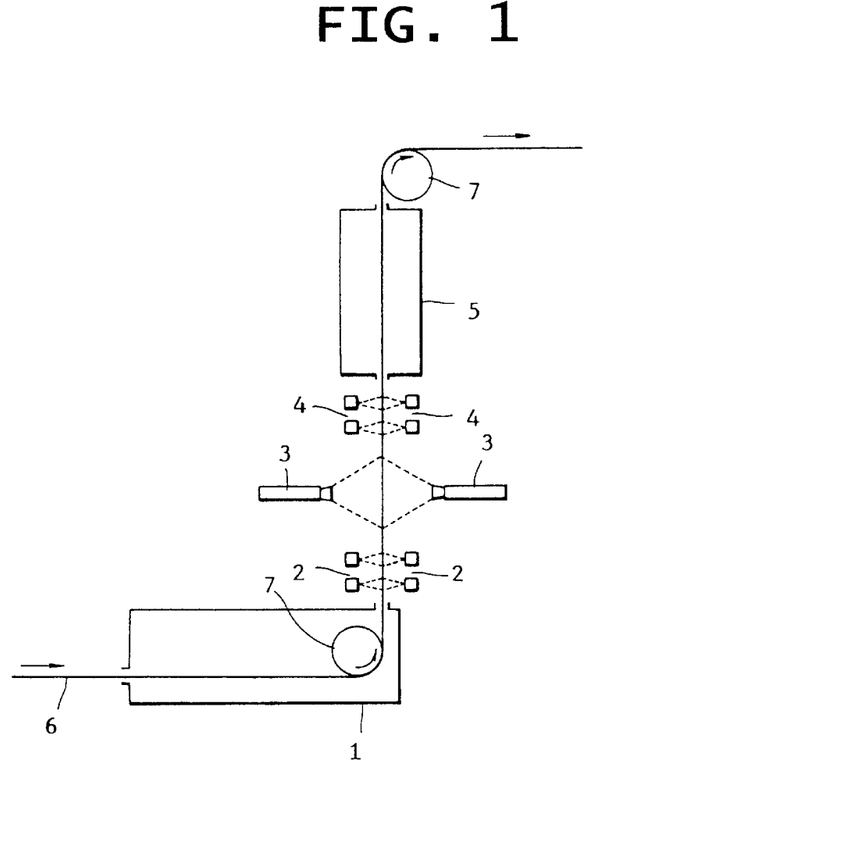
FIG. 1 is a schematic side section of a mat coater which forms mat on the photosensitive layer to produce the photosensitive planographic printing plate of the invention.

A mat coating apparatus for forming a mat layer is illustrated in FIG. 1. The apparatus comprises a temperature controlling chamber 1, wetting apparatuses 2, electrostatic coaters 3, wetting apparatuses 4 and a drying chamber 5 arranged in this order, and the aluminum web 6 travels through them successively. Numeral 7 indicates rollers.

By rendering the surface roughness of the surface (opposite surface) opposite to the photosensitive layer of the photosensitive planographic printing plate 0.15 or more, the coefficient of static friction between the opposite surface and the protection paper can be made 0.3 or more. A preferable coefficient of static friction is 0.25 or more. On the other hand, the coefficient of static friction is 0.8 or less at the maximum from the practical viewpoint. The surface roughness can be controlled by graining, such as ball graining, wire graining or blush graining, chemical etching or electrochemical method, described later. The coefficient of static friction may be controlled by selecting the size of abrasion or the size of blush in blush graining method.

Protection papers suitable for the package of the invention are kraft paper, synthesized paper and so on. It is preferable that the surface of the protection paper on the photosensitive layer side of the printing plate has a smoothness JIS P 8119 of 5 seconds or more, preferably 20 seconds or more. The surface having a smoothness of less than 5 seconds is inferior in the prevention of abrasion on the photosensitive layer. A suitable coating amount of the protection paper is from 15 g/m$^2$ to 100 g/m$^2$, preferably from 20 to 50 g/m$^2$.

Preferred supports applicable to the photosensitive planographic printing plate of the invention are made of metal (aluminum, steel, galvanized steel, tinplate, stainless steel, etc.), plastic, paper, and composit sheets thereof.

The aluminum plate usable as the support of the photosensitive planographic printing plate is selected from pure aluminum plates, aluminum alloy plates composed of aluminum as the principal component and minor foreign elements, and aluminum-laminated or deposited plastic films. As the foreign elements of the aluminum alloy, there are silicon, iron, manganese, copper, magnesium, chromium, zinc, bismuth, nickel, titanium and the like. A suitable content of the foreign elements is 10 wt. % or less as the total. Preferable aluminum plates are pure aluminum plates. However, since it is not easy to manufacture very pure aluminum, foreign elements may exist in a minor content. The composition of the aluminum plate used for the photosensitive planographic printing plate is not restricted, and, for example, JIS A 1050, JIS A 1100, JIS A 3103, JIS A 3005 are usable. A preferable thickness of the aluminum plate is about 0.1 to 0.6 mm.

The surface of the support is roughened by the electrochemical roughening which is carried out in a hydrochloric acid or nitric acid electrolyte, or the mechanical roughening, such as the wire brush graining wherein aluminum surface is scraped by metal wires, the ball graining which roughens aluminum surface by abrasive balls and abrasive agent and the brush graining using nylon brush and abrasive agent, or a combination of them.

The roughened support is then etched chemically by acid or alkali. Acid etching agent is disadvantageous because of requiring time for forming fine structure, but it can be improved by using alkali as the etching agent.

Preferable alkali etching agents are sodium hydroxide, sodium carbonate, sodium aluminate, sodium metasilicate, sodium phosphate, potassium hydroxide, lithium hydroxide, etc. A preferable concentration of the etching agent and etching temperature are 1 to 50% and 20 to 100° C., respectively, and a preferable dissolution amount of aluminum is 5 to 20 g/m$^2$.

After the etching, acid pickling is carried out in order to remove smut which remains on the surface. The acid used for pickling is nitric acid, sulfuric acid, phosphoric acic, chromic acid, fluoric acid, borofluoric acid, or the like. Especially, for the desmut treatment after electrochemical roughening, preferable methods are disclosed in Japanese Patent KOKAI No. 53-12739 wherein the etched surface is contacted with 15 to 65 wt. % sulfuric acid at 50 to 90° C., disclosed in Japanese Patent KOKOKU No. 48-28123 wherein alkali etching is carried out, and so on.

Although the aluminum plate treated as above can be used as the support for planographic printing plate, it may be further treated by anodic oxidation, chemical conversion, or the like.

The anodic oxidation can be carried out by a conventional method. In concrete, the aluminum plate is dipped in an aqueous or nonaqueous solution of sulfuric acid, phosphoric acid chromic acid, oxalic acid, sulfamic acid, benzenesulfonic acid or a combination of two or more of them, and direct current or alternating current is loaded to the aluminum plate. Thus, an oxide membrane layer is formed on the surface of the aluminum support.

The anodizing conditions vary according to the electrolytic solution employed, and, in general, suitable conditions are in the range of an electrolyte concentration of 1 to 80%, an electrolytic solution temperature of 5 to 70° C., a current density of 0.5 to 60 A/dm$^2$, a voltage of 1 to 100 V and an electrolytic time of 10 to 100 seconds.

Among various anodizing methods, anodizing in sulfuric acid at a great current density disclosed in GB 1,412,768 and anodizing in phosphoric acid disclosed in U.S. Pat. No. 3,511,661 are preferred.

After anodizing, the surface of the aluminum plate is optionally treated for rendering hydrophilic. As the treatment to render hydrophilic, there is the alkali metal silicate (e.g. sodium silicate aqueous solution) method disclosed in U.S. Pat. No. 2,714,066, U.S. Pat. No. 3,181,461, U.S. Pat. No. 3,286,734 and U.S. Pat. No. 3,902,734. In the method, the support is immersed or electrolyzed in the sodium silicate solution.

As other treatments to render hydrophilic, there are the treatment with potassium fluorozirconate disclosed in Japanese Patent KOKOKU No. 36-22063, the treatment with polyvinyl phosphonic acid disclosed in U.S. Pat. No. 3,276,868, U.S. Pat. No. 4,153,461 and U.S. Pat. No. 4,689,272, etc.

It is preferable that the aluminum plate is subjected to sealing treatment after the graining and anodizing. The sealing treatment is carried out by immersion in boiling water, boiling water containing an inorganic or organic salt, or water vapor bath.

The aluminum plate is optionally provided with an organic undercoating layer prior to applying a photosensitive layer. Illustrative of the organic compounds used for the organic undercoating layer are carboxymethyl cellulose, dextrin, gum arabic, organic phosphoric acids such as phosphonic acids having amino group, e.g. 2-aminoethyl phosphonic acid, phenyl phosphonic acids having or not having a substituent, napthylphosphonic acids, alkyl phosphonic acids, glycerophosphonic acids, methylene diphosphonic acids and ethylene diphosphonic acids, having or not having a substituent, organic phosphoric acids, such as phenylphosphoric acids, naphthylphosphoric acids, alkyl phosphoric acids and glycerophosphoric acids, having or not having a substituent, organic phosphinic acids, such as phenylphosphinic acids, naphthylphosphinic acids alkyl phosphinic acids and glycerophosphilic acids, having or not having a substituent, amino acids, such as glycine and β-alanine, hydrochloric acid salts of amines having hydroxyl group, such as triethanolamine hydrochloride, and combinations thereof.

The organic undercoating layer can be formed by the following methods. One method is of dissolving the above organic compound in water, an organic solvent, such as methanol, ethanol or methyl ethyl ketone or a mixed solvent thereof, and applying the solution onto the aluminum plate, followed by drying. Another method is of dissolving the above organic compound in water, an organic solvent, such as methanol, ethanol or methyl ethyl ketone or a mixed solvent thereof, and immersing the aluminum plate to adsorb the above organic compound, followed by washing with water or the like and then drying. In the former method, a solution containing 0.005 to 10 wt. % of the above organic compound is applied by various methods. Illustrative of the coating methods are the method using a coating rod disclosed in Japanese Patent KOKOKU No. 58-4589 and Japanese Patent KOKAI No. 59-123568, the method using an extrusion type coater disclosed in Japanese Patent KOKAI No. 4-244265, and the method using a slide bead coater disclosed in Japanese Patent KOKOKU No. 1-57629, Japanese Patent KOKAI No. 8-288656. The coating methods of the photosensitive composition described later are also usable.

In the later method, a suitable concentration of the organic compound is 0.01 to 20 wt. %, preferably 0.05 to 5 wt. %, a suitable immersion temperature is 20 to 90° C., preferably 25 to 50° C., and a suitable immersion time is 0.1 second to 20 minutes, preferably 2 seconds to 1 minute.

The pH of the solution of the organic compound can be adjusted in the range of 1 to 12 by using a basic material such as potassium hydroxide or an acidic material such as hydrochloric acid or phosphoric acid. A yellow pigment may be added in order to improve tone reproduction of the photosensitive planographic printing plate.

A suitable coating amount of the organic undercoating layer is 2 to 200 mg/m$^2$, preferably 5 to 100 mg/m$^2$ after drying. The coating amount of less than 2 mg/m² or more than 200 mg/m² results in insufficient printing durability.

A photosensitive layer composed of a known photosensitive composition is formed on the aluminum plate having a hydrophilic surface to obtain the photosensitive planographic printing plate.

As the photosensitive composition, there are positive types containing an o-quinone diazide compound as the principal component, and neganitive types containing a diazonium salt, an alkali-soluble diazonium salt, a photopolymerizable compound of which the principal component is a monomer having a double bond, and a photocrosslinking compound comprising cinnamic acid and dimethylmaleimide group, as the photosensitive material.

The photosensitive layer may be a photosensitive layer of electrophotographs which are disclosed in Japanese Patent KOKOKU Nos. 37-17172, 38-6961, 59-36259 and 59-25217, and Japanese Patent KOKAI Nos. 56-107246, 56-146145, 60-254142, 62-194257, 57-147656, 58-100862 and 57-161863, etc.

As the photopolymerizable compounds of which the principal component is a monomer having a double bond, compositions composed of an addition-polymerizable unsaturated compound having two or more end ethylene groups and a photopolymerization initiator are disclosed in U.S. Pat. No. 2,760,863, U.S. Pat. No. 3,060,023 and Japanese Patent KOKAI No. 59-53836.

The negative type photosensitive compositions containing a photocrosslinking compound comprising dimethylmaleimide group are disclosed in EP 0 410 654, and Japanese Patent KOKAI Nos. 52-988, 3-288853 and 4-25845.

Preferred o-naphthoquinone diazide compounds used for the positive type photosensitive composition are the esters of 1,2-diazonaphthoquinone sulfonic acid and pyrogallol acetone resin disclosed in Japanese Patent KOKOKU No. 43-28403. Other preferable orthoquinone diazide compounds are the esters of 1,2-diazonaphthoquinone-5-sulfonic acid and phenol-formaldehyde resin disclosed in U.S. Pat. No. 3,046,120 and U.S. Pat. No. 3,188,210, and the esters of 1,2-diazonaphthoquinone-1-sulfonic acid and phenol-formaldehyde resin disclosed in Japanese Patent KOKAI Nos. 2-96163, 2-96165 and 2-96761. Other useful o-naphthoquinone diazide compounds are disclosed in Japanese Patent KOKAI Nos. 47-5303, 48-13854, 48-63802, 48-63803, 48-96575 and 49-38701, Japanese Patent KOKOKU Nos. 37-18015, 41-11222, 45-9610 and 49-17481, U.S. Pat. No. 2,797,213, U.S. Pat. No. 3,453,400, U.S. Pat. No. 3,544,323, U.S. Pat. No. 3,573,917, U.S. Pat. No. 3,674,495, U.S. Pat. No. 3,785,825, GB 1,227,602, GB 1,251,345, GB 1,267,005, GB 1,329,888, GB 1,330,932, DE 854,890, etc.

Particularly preferable o-naphthoquinone diazide compounds are obtained through the reaction between polyhydroxy compound having a molecular weight of 1,000 or less and 1,2-diazonaphthoquinone sulfonic acid. Examples of the compounds are disclosed in Japanese Patent KOKAI Nos. 51-139402, 58-150948, 58-203434, 59-165053, 60-121445, 60-134235, 60-163043, 61-118744, 62-10645, 62-10646, 62-153950, 62-178562 and 64-76047, U.S. Pat. No. 3,102, 809, U.S. Pat. No. 3,126,281, U.S. Pat. No. 3,130,047, U.S. Pat. No. 3,148,983, U.S. Pat. No. 3,184,310, U.S. Pat. No. 3,188,210, U.S. Pat. No. 4,639,406, etc.

Upon synthesizing the o-naphthoquinone diazide compound, it is preferable to allow 0.2 to 1.2 equivalent amount of 1,2-diazonaphthoquinone sulfonic acid chloride to the hydroxyl group of the polyhydroxy compound to react therewith, and 0.3 to 1.0 equivalent amount is more preferred. Illustrative of 1,2-diazonaphthoquinone sulfonic acid chlorides are 1,2-diazonaphthoquinone-5-sulfonic acid chloride and 1,2-diazonaphthoquinone-4-sulfonic acid chloride.

Although the o-naphthoquinone diazide compound obtained is a mixture of those different in the bonding position and bonding rate of 1,2-diazonaphthoquinone sulfonic acid ester, it is preferable that the compound of which all hydroxyl groups are esterified by 1,2-diazonaphthoquinone sulfonic acid ester occupies a rate (the content of completely esterified compound) of 5 mol. % or more of the mixture, more preferably 20 to 99 mol. %.

A preferable content of the photosensitive compound (containing the above combination) functioning as the positive type in the photosensitive composition is 10 to 50 wt. %, more preferably 15 to 40 wt. %.

Although the photosensitive layer is contituted by the o-quinone diazide compound alone, it is preferable to combine an alkaline water-soluble resin as binder. Illustrative of the alkaline water soluble resins are Novolak type resins, such as phenol-formaldehyde resins, o-, m- and p-cresol-formaldehyde resins, m/p-cresol-formaldehyde resin mixtures and phenol/cresol (irrespective of o-, m-, p-, m/p- or o/m-mixture)-formaldehyde resin mixtures.

Phenol-modified xylene resins, polyhydroxystyrenes, polyhalogenated hydroxystyrenes and acrylic resins having phenolic hydroxyl group disclosed in Japanese Patent KOKAI No. 51-34711 are also usable as the binder.

Other suitable binders are the copolymers containing the following monomer (1)–(13) as the constituent and having a molecular weight, in general, of 10,000 to 200,000.

(1) Acrylamides, methacrylamides, acrylic esters and methacrylic esters having aromatic hydroxyl group and hydroxystyrenes:

N-(4-hydroxyphenyl) acrylamide, N-(4-hydroxyphenyl) methacrylamide, o-, m- or p-hydroxystyrene, o-, m- or p-hydroxyphenyl acrylate, methacrylate, etc.

(2) Acrylic acid esters and methacrylic acid esters having aliphatic hydroxyl group:

2-Hydroxyethylacrylate, 2-hydroxyethylmethacrylate, etc.

(3) Unsaturated carboxylic acids:

Acrylic acid, methacrylic acid, maleic anhydride, mesaconic acid, etc.

(4) Acryli esters and substituted acrylic esters:

Methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N-dimethylaminoethyl acrylate, etc.

(5) Methacrylic esters and substituted methacrylic esters:

Methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N-dimethylaminoethyl methacrylate, etc.

(6) Acrylamides and methacrylamides:

Acrylamide, methacrylamide, N-methalolacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, N-ethyl-N-phenylmethacrylamide, etc.

(7) Vinyl ethers:

Ethyl vinyl ether, 2-chloroethyl vinyl ether, hydroxyethyl vinyl ether, propyl vinyl ether, butyl vinyl ether, octyl vinyl ether, phenyl vinyl ether, etc.

(8) Vinyl esters:

Vinyl acetate, vinyl chloroacetate, vinyl butyrate, vinyl benzoate, etc.

(9) Styrenes:

Styrene, methylstyrene, chloromethylstyrene, etc.

(10) Vinyl ketones:

Methyl vinyl ketone, ethyl vinyl ketone, propyl vinyl ketone, phenyl vinyl ketone, etc.

(11) Olefins:

Ethylene, propylene, isobutylene, butadiene, isoprene, etc.

(12) N-Vinyl pyrrolidone, N-vinyl carbazole, 4-vinyl pyridine, a crylonitrile, methacrylonitrile, etc.

(13) Unsaturated sulfonamides:

Acrylamides; N- (o- amino sulfonylphenyl) acrylamide, N-(m-aminosulfonylphenyl) acrylamide, N-(p-aminosulfonylphenyl) acrylamide, N-[1-(3-aminosulfonyl) naphthyl] acrylamide, N-(2-aminosulfonylethyl) acrylamide, etc. Methacrylamides; N-(o-aminosulfonylphenyl) methacrylamide, N-(m-aminosulfonylphenyl) methacrylamide, N-(p-aminosulfonylphenyl) methacrylamide, N-[1-(3-aminosulfonyl)naphthyl] methacrylamide, N-(2-aminosulfonylethyl) methacrylamide, etc. Acrylic esters; o-Aminosulfonylphenyl acrylate, m-aminosulfonylphenyl acrylate, p-aminosulfonylphenyl acrylate, 1-(3-aminosulfonylphenylnaphthyl) acrylate, etc. Methacrylic esters; o-Aminosulfonylphenyl methacrylate, m-aminosulfonylphenyl methacrylate, p-aminosulfonylphenyl methacrylate, 1-(3-aminosulfonylphenylnaphthyl) metharylate, etc.

Furthermore, other monomers polymerizable with the above monomer may be copolymerized. Moreover, the copolymer obtained by copolymerizing the above monomer may be modified by glycidyl acrylate, glycidymethacrylate or the like.

It is preferable that the above copolymer contains the unsaturated carboxylic acid listed in (3), and a preferable acid value of the copolymer is 0 to 10 meq/g, preferably 0.2 to 5 meq/g. A preferable molecular weight of the above copolymer is 10,000 to 100,000.

To the copolymer, polyvinyl butyral resin, polyurethane resin, polyamide resin or epoxy resin may be added.

Two or more of the above alkali-soluble polymers may be combined. The blending amount of the alkali-soluble polymer is 80 wt. % or less of the photosensitive composition.

Moreover, as disclosed in U.S. Pat. No. 4,123,279, it is preferable to combine a condensate of a phenyl having an alkyl group of 3–8 carbon atoms as the substituent and formaldehyde, such as t-butylphenol-formaldehyde resin and octylphenol-formaldehyde resin, in view of the improvement in image sensitization.

In order to improve sensitivity, it is preferable to add a cyclic acid anhydride, a phenol or an organic acid to the photosensitive composition.

Illustrative of the cyclic acid ankydrides are disclosed in U.S. Pat. No. 4,115,128, such as phthalic anhydride, tetrahydrophthalic anhydride, hexahydrophthalic anhydride, 3,6-endoxy- Δ4-tetrahydrophthalic anhydride, tetrachlorophthalic anhydride, maleic anhydride, chloromaleic anhydride, phenylmaleic anhydride, succinic anhydride and pyromellitic anhydride.

Illustrative of the phenols are bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxy-triphenylmethane and 4,4',3",4"-tetrahydroxy-3,5,3',5'-tetramethyltriphenylmethane.

As the organic acids, there are those disclosed in Japanese Patent KOKAI Nos. 60-88942, 2-96755, such as sulfonic acids, sulfinic acids, alkyl sulfuric acids, phosphonic acids, phosphoric esters and carboxylic acids, and examples are p-toluenesulfonic acid, dodecylbenzenesulfonic acid, p-toluenesulfinic acid, ethyl sulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicarboxylic acid, erucic acid, lauric acid, n-undecanoic acid, ascorbic acid, and the like.

A suitable content of the cyclic acid anhydride, the phenol and the organic acid is 0.05 to 15 wt. %, preferably 0.1 to 5 wt. %, as the total (?).

To the photosensitive composition, a nonionic surfactant as disclosed in Japanese Patent KOKAI No. 62-251740 or an ampholytic surfactant as disclosed in Japanese Patent KOKAI Nos. 59-121044 or 4-13149 can be added in order to widen the stability to developing conditions (latitude in development).

Illustrative of the nonionic surfactants are sorbitan tristearate, sorbitan monopalmitate, sorbitan trioleate, stearic acid monoglyceride, polyoxyethylene sorbitan monooleate and polyoxyethylene nonylphenyl ether.

Illustrative of the ampholylic surfactants are alkyldi (aminoethyl) glycine, alkylpolyaminoethylglycine hydrochloride, 2-alkyl-N-carboxyethyl-N-hydroxyethylimidazoliniumbetaine, N-tetradecyl-N,N-betaine type (e.g. "Amogen", Daiichi Kogyo Seiyaku) and alkylimidazolines (e.g. "Lebon 15", Sanyo Chemical Ind.).

A suitable content of the nonionic surfactant and the ampholytic surfactant is 0.05 to 15 wt. %, preferably 0.1 to 5 wt. % of the photosensitive composition.

To the photosensitive composition, a print-out agent for obtaining a visible image immediately after exposure, a dye or pigment as an image colorant can be added.

Representative print-out agent is a combination of a compound releasing an acid by exposure (photo acid-releasing agent) and an organic dye forming a salt. Illustrative of the print-out agents are combinations of o-naphthoquinonediazide-4-sulfonic acid halogenide and a salt-forming organic dye disclosed in Japanese Patent KOKAI Nos. 50-36209, 53-8128 and combinations of a trihalomethyl compound and a salt-forming organic dye disclosed in Japanese Patent KOKAI Nos. 53-36223, 54-74728, 60-3626, 61-143748, 61-151644, 63-58440. As the trihalomethyl compound, there are oxazole compounds and triazine compounds. Both of them are excellent in stability with time and make clear print-out images.

As the colorant, various dyes can be used in addition to the aorementioned salt-forming organic dyes. Suitable dyes are oil-soluble dyes and basic dyes, including the salt-forming organic dyes. Illustrative of the dyes are Oil Yellow #101, Oil Yellow #103, Oil Pink #312, Oil Green BG, Oil Blue BOS, Oil Blue #603, Oil Black BY, Oil Black BS, Oil Black T-505 (Orient Kagaku Kogyo), Victoria Pure Blue, Crystal Violet (CI 42555, Methyl Violet (Cl 42535), Ethyl Violet, Rhodamine B (CI 145170B), Malachite Green (CI 142000), Methylene Blue (CI 52015), etc. Dyes disclosed in Japanese Patent KOKAI No. 62-293247 are particularly preferred.

The photosensitive composition is dissolved in a solvent, and applied onto the aluminum plate, followed by drying.

The application can be carried out by the method of using a coating rod disclosed in Japanese Patent KOKOKU No. 58-4589 and Japanese Patent KOKAI No. 59-123568, the method of using an extrusion type coater disclosed in Japanese Patent KOKAI No. 4-24265, the method of using a slide bead coater disclosed in Japanese Patent Application No. 8-288656, etc.

Figure 2:
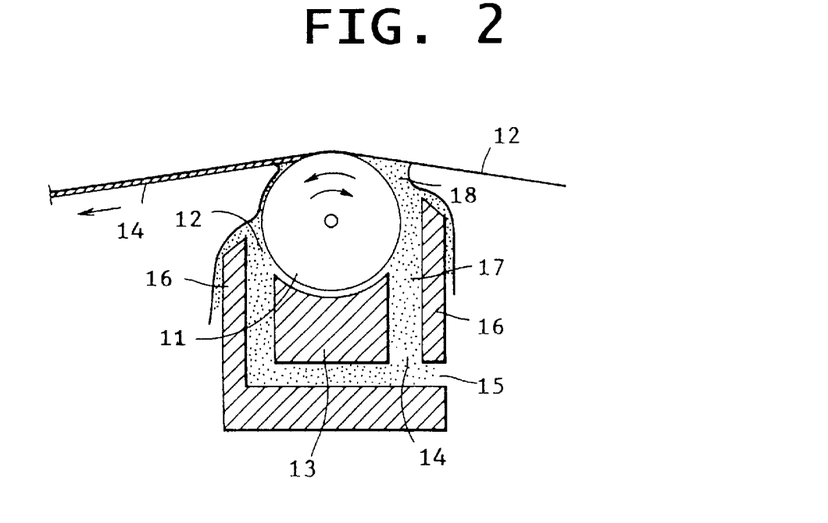
FIG. 2 is a schematic side section of a coating apparatus for coating the photosensitive layer on the support to produce a photosensitive planographic printing plate.

The application using a coating rod is illustrated in FIG. 2. In FIG. 2, 11 is a wire bar or a grooving bar, and rotates in the same direction or opposite direction to the web 12 traveling continuously. 13 is a bar carrier provided in the full length of the coating bar 11. The bar carrier 13 supports the coating bar 11 so as not to be warped, and also functions as a feeder of the coating solution 14 to the coating bar 11. That is, the coating solution 14 is supplied to the guide channel 17 formed between the side wall of the bar carrier 13 and the dam member 16, taken by the rotating bar 11, and then applied to the web 12. At that time, the coating solution 14 is weighed at the contact part of the bar 11 with the web 12, and the designed coating amount is applied onto the web 12. The remainder flows down, and forms a pool 18 together with newly supplied coating solution 14.

In the method, the coating amount is controlled by the size of grooves on the surface of the coating bar. That is, in the case of a wire bar which is formed of a rod wound by a wire, the coating amount is controlled by the size of the wire. The coating amount is not restricted but, in general, 3 to 100 cc/m$^2$.

The diameter of the coating bar is, in common, 3 to 20 mm, the rotating direction may be identical with or opposite to the traveling direction of the web. The coating speed is in the range of 10 to 150 m/min. Concerning the properties of the coating solution, a preferable viscosity is 0.7 to 500 cp, more preferably 0.7 to 100 cp, a preferable surface tension is 20 to 70 dyn/cm, more preferably 25 to 50 dyn/cm, and a preferable specific gravity is 0.8 to 1.5.

Another application method comprises discharging the coating solution from an extrusion-type feeder, forming a bridge of the coating solution on the traveling aluminum web engaged by a backup roller, and applying the coating solution to the web by sucking the back of the bridge or pressurizing the front of the bridge.

Figure 3:
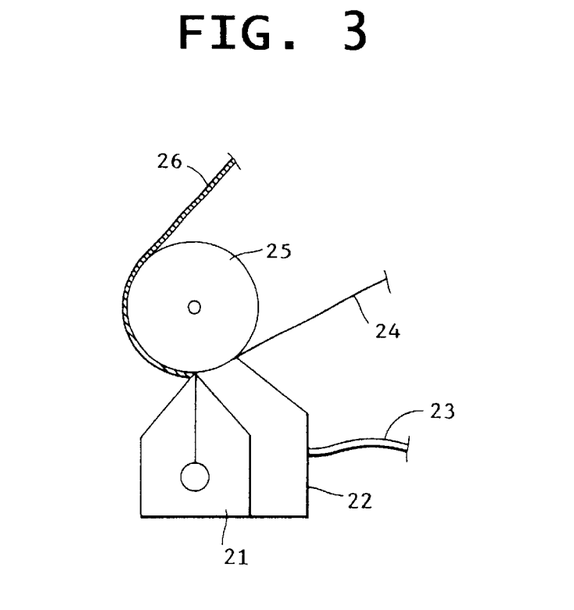
FIG. 3 is a schematic side section of another coating apparatus.

An extrusion coating apparatus is illustrated in FIG. 3 which comprises an extrusion coater 21, a vacuum chamber 22 provided with a vacuum pipe and a backup roller 25. 24 is the aluminum web, and 26 is the coating solution.

In this apparatus, the coating amount depends on the clearance between the top of the extrusion coater 21 and the aluminum web, and can vary in the range of about 10 to 500 cc/m$^2$. Concerning the properties of the coating solution, a preferable viscosity is 0.7 to 1,000 cp, more preferably 0.7 to 100 cp, a preferable surface tension is 20 to 70 dyn/cm, more preferably 25 to 50 dyn/cm, and a preferable specific gravity is 0.8 to 1.5. The clearance between the top of the extrusion coater and the aluminum web is, in general, about 0.1 to 0.5 mm.

The photosensitive planographic printing plate thus formed is then dried.

As the drying method, there are the method of using an arch type dryer wherein pass rollers are arranged in the drying chamber and the web is allowed to travel passing through the rollers disclosed in Japanese Patent KOKAI Publication No. 6-63487, the method of drying web floated by jetting air from nozzles from both of the upper side and the underside of the web, the method of drying using radiant heat generated by heating various media to a high temperature without using hot air, the method of drying using heat transfer by contacting a roller heated by various media with the web, and the like.

Figure 4:
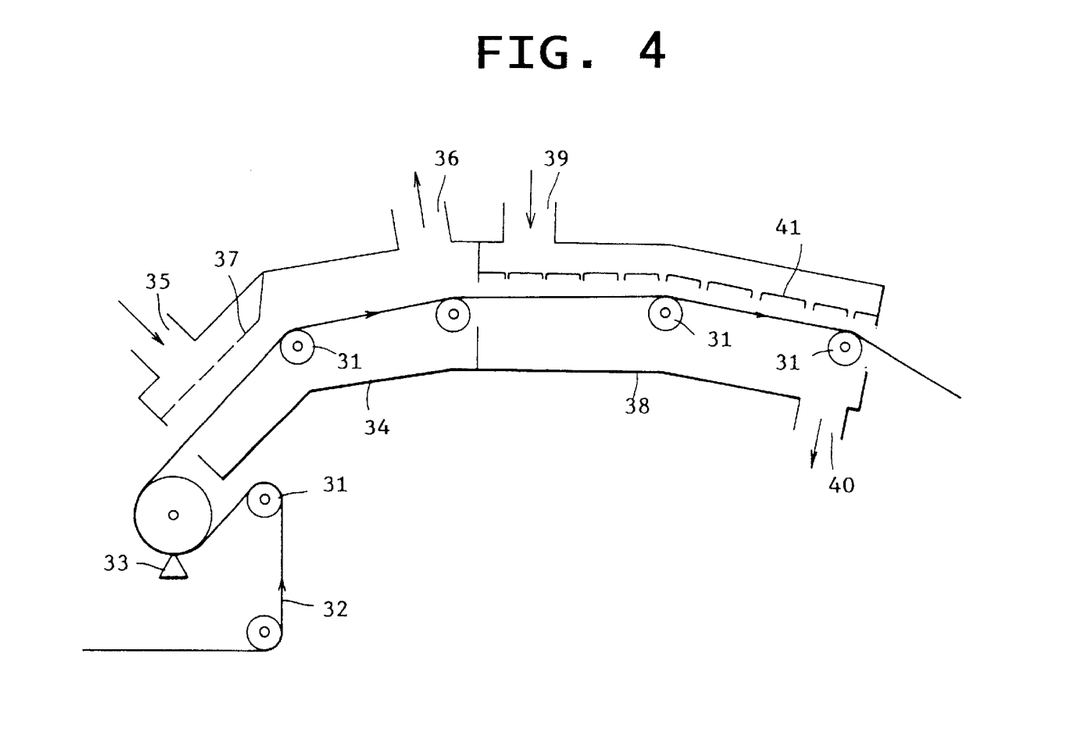
FIG. 4 is a schematic side section of a drying apparatus for drying the photosensitive layer coated on a support.

A drying method using hot air is illustrated in FIG. 4. In the method, the aluminum web 32 travels continuously with guided by guide rollers 31, and the coating solution containing solvent is applied at the coating portion 33. The coated web enters in the first step drying zone 34 provided with an air inlet 35 and an exhaust port 36. Hot air having a temperature of 40 to 130° C. and a dew point of −5 to 15° C. is supplied from the air inlet 35, and rectified by the rectifier plate 37. Then, the hot air is contacted with the surface of the coating layer of the aluminum web 32 at a wind velocity of 0.5 to 4 m/sec. to dry the coating layer, and discharged from the exhaust port 36. The coating layer of the aluminum web 32 reaching the exit of the first step drying zone 34 is in a soft membrane state. The aluminum web 32 traveling continuously with the guide by guided rollers 31 enters into the second step drying zone 38 provided with an air inlet and an exhaust port 40. Hot air having a temperature of 60 to 150° C. and a dew point of 5 to 20° C. is supplied from the air inlet 39, and blown from slit nozzles 41 at a wind velocity of 5 to 15 m/sec. The hot air is contacted vigorously with the surface of the coating layer to evaporate the remaining solvent. Thereby, the coating layer is cured. After the contacting, the air is discharged from the exhaust port 40.

The slit nozzles have a slit clearance of 0.2 to 8 mm, a pitch of 3 to 300 mm and a distance between the nozzle and the web of 5 to 20 mm.

The solvent is, for example, an organic solvent or a solvent mixture disclosed in Japanese Patent KOKAI No. 62-251739. The photosensitive composition is dissolved or suspended at a concentration of 2 to 50 wt. % as solid weight, and applied onto the support, followed by drying. The coating amount of the photosensitive layer on the support varies according to its use, and, in general, 0.3 to 4 g/m$^2$ as dry weight is preferable. The less coating amount results in the smaller exposure for obtaining images, but the membrane strength decreases. On the other hand, the greater coating amount requires the greater exposure, and the membrane strength becomes strong. For example, a printing plate capable of printing many times (great printing durability) can be obtained.

To the photosensitive composition, a surfactant for the improvement in the quality of the coated surface can be added, such as a fluorine-containing surfactant disclosed in Japanese Patent KOKAI No. 62-170950. A preferable blending amount is 0.001 to 1 wt. %, more preferably 0.005 to 0.5 wt. % of the photosensitive composition.

As the photosensitive layer for negative type photosensitive planographic printing plates, there are the photosensitive layers containing a photosensitive diazo compound, photopolymerizable photosensitive layers and photocrosslinking photosensitive layers. Among them, the photosetting photosensitive duplicating materials comprising a photosensitive diazo compound are explained below.

Preferable photosensitive diazo compounds are diazo resins produced by condensing an aromatic diazonium salt with an organic condensation agent containing a reative carbonyl group, especially an aldehyde such as formaldehyde or acetaldehyde or an acetal, in an acidic medium. A representative one is a condensate of p-diazodiphenylamine and formaldehyde. The syntheses of these diazo resins are disclosed, for example, in U.S. Pat. No. 2,678,498, U.S. Pat. No. 3,050,502, U.S. Pat. No. 3,311,605 and U.S. Pat. No. 3,277,074.

Other preferable photosensitive compounds are diazonium compounds disclosed in Japanese Patent KOKOKU No. 49-48001 which are co-condensates of an aromatic diazonium salt and a substituted aromatic compound not containing diazonium group. Among them, co-condensed diazonium compounds with an aromatic compound wherein carboxyl group is substituted by an alkali-soluble group such as hydroxyl group.

Still other preferable photosensitive compounds are photosensitive diazo compounds disclosed in Japanese Patent KOKAI Nos. 4-18559, 4-190361 and 4-17353 which are condensates of an aromatic diazonium salt with a reactive carbonyl compound having analkali-soluble group.

Although there are the diazo resins using an inorganic anion, such as mineral acid, e.g. hydrochloric acid, hydrobromic acid, sulfuric acid or phosphoric acid, or a double salt, e.g. zinc chloride, as the counter anion of the above diazonium salt, substantially water-insoluble organic solvent-soluble diazo resins are particularly preferred. The preferable diazo resins are disclosed in detail in Japanese Patent KOKOKU No. 47-1167 and U.S. Pat. No. 3,300,309.

Other preferable diazo resins are those using a halogenated Lewis acid, such as tetrafluoroboric acid or hexafluorophosphoric acid, or a perhalogen acid, such as perchloric acid or periodic acid as the counter anion, disclosed in Japanese Patent KOKAI Nos. 54-98613 and 56-121031.

Still other preferable diazo resins are those using a sulfunic acid having a long chain alkyl group as the counter anion, disclosed in Japanese Patent KOKAI Nos. 58-209733, 62-175731 and 63-262643.

A suitable content of the photosensitive diazo compound is 5 to 50 wt. %, preferably 8 to 20 wt. % of the photosensitive layer.

It is preferable to combine an alkaline water-soluble or swellable lipophilic polymer compound as binder with the photosensitive diazo compound. Suitable polymer compounds used as the lipophilic polymer compound are the copolymers of which the constituent is the monomer(s) shown in the aforementioned (1) to (13) and the molecular weight is, in general, 10,000 to 200,000, similar to those described previously in the positive type photosensitive composition. Furthermore, the polymer compound produced by copolymerizing the monomer(s) shown in (14) or (15) as the constituent.

(14) Unsaturated imides:
  Maleimide, N-acryloylacrylamide, N-acetylacrylamide, N-propionylacrylamide, N-(p-chlorobenzoyl) acrylamide, N-acryloylmethacrylamide, N-acetylmethacylamide, N-propionylmethacrylamide, N-(p-chlorobenzoyl)methacrylamide, etc.

(15) Unsaturated monomers having a crosslinking group as the side chain:
  N-[2-(acryloyloxy)-ethyl]-2,3-dimethylmaleimide, N-[6-(methacryloyloxy)-hexyl]-2,3-dimethylmaleimide, vinyl cinnamate, etc.

Furthermore, another monomer polymerizable with the above monomer may be copolymerized. Moreover, the copolymer obtained by copolymerizing the above monomer may be modified by glycidyl acrylate, glycidymethacrylate or the like.

It is preferable that the above copolymer contains the unsaturated carboxylic acid listed in (3), and a preferable acid value of the copolymer is 0 to 10 meq/g, preferably 0.2 to 5 meq/g. A preferable molecular weight of the above copolymer is 10,000 to 100,000.

To the copolymer, polyvinyl butyral resin, polyurethane resin, polyamide resin or epoxy resin may be added. Besides, Novolak type resin, phenol-modified xylene resin, polyhydroxystyrene and polyhalogenated hydroxystyrene and moreover an alkali-soluble resin having a phenolic hydroxyl group as disclosed in Japanese Patent KOKAI No. 51-43711 can also be used.

Two or more of the above alkali-soluble polymers may be combined. The blending amount of the alkali-soluble polymer compound is, in general, 40 to 95 wt. % of the total solid components of the photosensitive composition.

To the photosensitive composition, a sensitizer for the improvement in the sensitivity of image is added, such as a half esterified product of styrene-maleic anhydride copolymer with alcohol, Novolak resin and 50% fatty acid ester of p-hydroxystyrene, disclosed in Japanese Patent KOKAI No. 55-527.

Futhermore, a plasticizer is added for imparting flexibility and wear resistance to the coating layer. Iluustrative of the plasticizers are butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid, and tricresyl phosphate is particularly preferred.

To the photosensitive composition, an acid is added for widening stability with time, such as phosphoric acid, phosphorous acid, citric acid, oxalic acid, dipicolinic acid, benzenesulfonic acid, naphthalenesulfonic acid, sulfosalicylic acid, 4-methoxy-2-hydroxybenzophenone-5-sulfonic acid, tartaric acid, etc.

Moreover, a print-out agent for obtaining a visible image immediately after exposure or a dye or a pigment as the image colorant can be added.

Preferable colorants react with free radical or acid to vary color tone, and exemplary colorants which vary color from colored to colorless or a different color are triphenylmethanes, diphenylmethanes, oxazines, xanthenes, iminonaphthoquinones, azomethines and anthraquinones, such as Oil Yellow #101, Oil Yellow #103, Oil Pink #312, Oil Red, Oil Green BG, Oil Blue BOS, Oil Blue #603, Oil Black BY, Oil Black BS, Oil Black T-505 (Orient Kagaku Kogyo), Victoria Pure Blue BOH (Hodogaya Kagaku), Patent Pure Blue (Sumitomo Mikuni Kagaku), Crystal Violet (CI 42555), Methyl Violet (CI 42535), Ethyl Violet, Rhodamine B (CI 145170B), Malachite Green (CI 142000), Methylene Blue (CI 52015), Brilliant Blue, Methyl Green, Erythrocin B, Basic Fuchsine, m-Cresol Purple, Auramine, 4-p-diethylaminophenyliminaphthoquinone, cyano-p-diethylaminophenylacetanilide, etc.

On the other hand, color developing agents which vary color from colorless to colored are leuco dyes and primary or secondary arylamine dyes, such as triphenylamine, diphenylamine, o-chloroaniline, 1,2,3-triphenylganidine, naphthylamine, diaminodiphenylmethan, p,p'-bis-dimethylaminodiphenylamine, 1,2-dianilinoethylene, p,p', p"-tris-dimethylaminotriphenylmethane, p,p'-bis-dimethylaminodiphenylmethylimine, p,p',p"-triamino-o-methyltriphenylmethan, p,p'-bis-dimethylaminodiphenyl-4-anilinonaphthylmethane, p,p',p"-triaminotriphenylmethane, etc.

More preferable ones are triphenylmethane dyes and diphenylmethane dyes, particularly preferable ones are triphenylmethane dyes, especially Victoria Pure Blue BOH.

A suitable content of the above colorant is about 0.5 to 10 wt. %, preferably about 1 to 5 wt. % of the photosensitive composition.

To the photosensitive composition, a cyclic acid anhydride, a phenol, an organic acid or a higher alcohol can be added in order to improve developing ability.

The photosensitive composition is dissolved or suspended in a solvent, such as an organic solvent or a solvent mixture disclosed in Japanese Patent KOKAI No. 62-251739 at a concentration of 2 to 50 wt. % as solid weight, and applied onto the support, followed by drying, similar to the positive type photosensitive composition. The coatin amount of the photosensitive layer on the support varies according to its use, and, in general, 0.3 to 4 g/m$^2$ as dry weight is preferable. The less coating amount results in the smaller exposure for obtaining images, but the membrane strength decreases. On the other hand, the greater coating amount requires the greater exposure, and the membrane strength becomes strong. For example, a printing plate capable of printing many times (great printing durability) can be obtained.

To the photosensitive composition, a surfactant for the improvement in the quality of the coated surface can be added, similar to the positive type photosensitive composition.

To the face opposite to the photosensitive layer of the photosensitive planographic printing plate of the invention, a coating layer (back coating layer) composed of an organic polymer compound can be provided.

The principal component of the back coating layer can be selected from saturated copolymer polyester resin, phenoxy resin, polyvinyl acetal resin and vinylidene chloride copolymer resin, having a glass transition point of 20° C. or more. The saturated copolymerized polyester resin is composed of dicarboxylic acid unit and diol unit. Illustrative of the dicarboxylic units of the polyester are aromatic dicarboxylic acids, such as phthalic acid, terephthalic acid, isophthalic acid, tetrabromophthalic acid and tetrachlorophthalic acid, and saturated aliphatic dicarboxylic acids, such as adipic acid, azelaic acid, succinic acid, oxalic acid, suberic acid, sebacic acid, malonic acid and 1,4-cyclohexane dicarboxylic acid.

Optional additives of the back coating layer are dye or pigment for coloring, silane coupling agent, the diazo resin composed of diazonium salt, organic phosphonic acid, organic phosphoric acid, cationic polymer and the like for improving adhesiveness to the aluminum support, wax, higher fatty acid, higher fatty amide, the silicone compound composed of dimethylsiloxane, modified dimethylsiloxane, polyethylene powder and the like used as lubricant, and so on.

The thickness of the back coating layer is enough of preventing the photosensitive layer from abrasion without a protection paper, and a suitable thickness is 0.01 to 8 μm. When the thickness is less than 0.01 μm, the occurrene of abrasion of the photosensitive layer cannot be prevented in the stack of the photosensitive planographic printing plate. When the thickness exceeds 8 μm, the printing pressure is influenced by the swelling of the back coating layer caused by the reagents used in the circumstance of the printing plate during printing to degrade printing properties.

The back coating layer can be provided on the opposite surface of the aluminum plate by various methods. For example, a method is of preparing a solution or an emulsion of the back coating layer composition by using a suitable solvent, and applying it to the aluminum web followed by drying. Another method is of making a film of the back coating layer composition, and adhering it to the aluminum plate by an adhesive or heating. Still another method is of forming a melt film of the back coating layer composition by a melt extruder, and adhering it to the aluminum plate. The most preferable method among them is of preparing a solution and applying it in view of ensuring the above coating amount. The solvent may be an organic solvent or a solvent mixture selected from those disclosed in Japanese Patent KOKAI No. 62-251739.

Upon manufacturing the photosensitive planographic printing plate, either of the back coating layer or the photosensitive layer may be applied previously, or both layers may be applied simultaneously.

EXAMPLES

Example 1

A JIS A 1050 aluminum plate 0.24 mm in thickness was treated with brush graining using a nylon brush having a bristle diameter of 0.57 to 0.72 mm with varying immpression strength while supplying aqueous pumice suspension to the surface of the aluminum plate.

The surface roughened by the brush graining was washed well with water, and then, etched by immersing in 10% sodium hydroxide aqueous solution at 60° C. for 25 seconds. The etched surface was washed by running water, washed to neutralize with 20% nitric acid, and washed with water again. The aluminum plate was subjected to electrolytic roughening using an alternating waveform current of sine wave at a quantity of electricity at anode of 100 to 600 coulombs/dm$^2$ in 1% nitric acid aqueous solution. Subsequently, the aluminum plate was immersed in 1% sodium hydroxide aqueous solution at 40° C. for 30 seconds, and desmutted by immersing in 30% sulfuric acid aqueous solution at 60° C. for 40 seconds. Then, the aluminum plate was anodized by direct current in 20% sulfuric acid aqueous solution at a current density of 5 A/dm$^2$ so as to form an oxide membrane of 1.6 g/m$^2$ to prepare the support.

The undercoating solution having the following composition (viscosity : 1.1 cp, surface tension : 450 dyn/cm) was applied to the surface of the support by a bar coater in a wet coating amount of 9.5 cc/m$^2$ at a coating speed of 50 m/min, and dried at 80° C. for 30 seconds. The coating amount after drying was 30 mg/m$^2$.

Undercoating Solution:

| | |
|---|---|
| Aminoethylphosphonic acid | 0.10 g |
| Phenylphosphonic acid | 0.15 g |
| β-Alanine | 0.10 g |
| Methanol | 40 g |
| Pure water | 60 g |

Onto the undercoated support, the photosensitive solution having the following composition (viscosity: 2.3 cp, surface tension: 36 dyn/cm) was applied by a bar coater in a wet coating amount of 25 cc/m$^2$ at a coating speed of 50 m/sec. and dried at 110° C. for 1 minute to form the photosensitive layer of about 2.0 g/m$^2$.

Photosensitive solution:

| | |
|---|---|
| Esterified product of 1,2-diazonaphthoquinone-5-sulfonylchloride and pyrogallol-acetone resin (described in Example 1 of U.S. Pat. No. 3,635,709) | 0.45 g |
| Cresol-formaldehyde Novolak resin (meta-:para- | 1.1 g |

-continued

| | |
|---|---|
| ratio = 6:4, weight average molecular weight: 3,000, number average molecular weight: 1,100, containing 0.7% unreacted cresol) | |
| m-Cresol-formaldehyde Novolak resin (weight average molecular weight: 1,700, number average molecular weight: 600, containing 1% unreacted cresol) | 0.3 g |
| Poly [N-(p-aminosulfonylphenyl) acrylamide-co-normalbutylacrylate-co-diethylene glycol monomethyl ether methacrylate (moler ratio of each monomer = 40:40:20 in the above order, weight average molecular weight: 40,000, number average molecular weight: 20,000) | 0.2 g |
| p-Normaloctylphenol-formaldehyde resin (disclosed in U.S. Pat. No. 4,123,279) | 0.02 g |
| Naphthoquinone-1,2-diazido-4-sulfonic acid chloride | 0.01 g |
| Tetrahydrophthalic anhydride | 0.1 g |
| Benzoic acid | 0.02 g |
| 4-[p-N,N-bis(ethoxycarbonylmethyl)aminophenyl]-2,6-bis(trichloromethyl)-s-triazine | 0.01 g |
| 4-[p-N-(p-hydroxybenzoyl)aminophenyl]-2,6-bis(trichloromethyl)-s-triazine | 0.02 g |
| 2-trichloromethyl-5-(4-hydroxystyryl)-1,3,4-oxadiazole | 0.01 g |
| Victoria Pure Blue BOH (counter anion: 1-naphthalenesulfonic acid) | 0.02 g |
| Fluorine-containing surfactant "Modiper F-200" (Nippon Oil and Fats, 30 wt. % methyl ethyl ketone/methyl isobutyl ketone mixture solution) | 0.06 g |
| Fluorine-containing surfactant "Megafuc F 177" (Dainippon Ink and Chemicals, 20 wt. % methyl isobutyl ketone solution) | 0.02 g |
| Methyl ethyl ketone | 15 g |
| 1-Methoxy-2-propanol | 10 g |

Onto the photosensitive layer, a mat layer was formed by electrostatic spraying of methyl methacrylate-ethyl acrylate-sodium acrylate (molar ratio=68:20:12) copolymer aqueous solution having a viscosity of 4.0 cp and a surface tension of 43 dyn/cm according to Example 1 of Japanese Patent KOKOKU No. 61-28986 with varying the supply amount.

The convex of the mat layer was in a density of 1,000 convexes/cm$^2$ and a mean height of 4.0 μm. The surface roughness of the opposite side to the photosensitive layer was 0.25.

A protection paper was prepared by beating bleached kraft pulp and diluting to a concentration of 4% to obtain a paper stock. To the paper stock, aluminum sulfate was added, until the pH became 5.0. Using the paper stock, the protection paper for photosensitive printing plates was made of having a density of 0.75 g/cm$^2$, a smoothness of the glossy face of 60 seconds, a moisture content of 5.5% and an areal weight of 35 g/m$^2$.

The static friction coefficient between the protection paper and the photosensitive layer of the photosensitive planographic printing plate was 0.60, and the static friction coefficient between the protection paper and the opposite surface of the photosensitive planographic printing plate was 0.64.

Example 2

The photosensitive planographic printing plate was the same as Example 1, except that the density of the convexes was controlled 150 convexes/cm$^2$ by changing the rotation speed of the cup.

The protection paper was the same as Example 1.

The static friction coefficient between the protection paper and the photosensitive layer was 0.40, and the static friction coefficient between the protection paper and the opposite surface was 0.64.

Example 3

The photosensitive planographic printing plate was the same as Example 1.

The protection paper was the same as Example 1, except that polyethylene was laminated onto one face of the protection paper according to the lamination method disclosed in detail in Japanese Patent KOKOKU No. 57-23259.

The static friction coefficient between the protection paper and the photosensitive layer was 0.70, and the static friction coefficient between the protection paper and the opposite surface was 0.64.

Example 4

The photosensitive planographic printing plate was the same as Example 1, except that the density of the convexes was controlled 10,000 convexes/cm$^2$ by changing the rotation speed of the cup.

The protection paper was the same as Example 1.

The static friction coefficient between the protection paper and the photosensitive layer was 0.76 and the static friction coefficient between the protection paper and the opposite surface was 0.64.

Example 5

The photosensitive planographic printing plate was the same as Example 1, exept that the mean height of the convexes of the mat layer was 6.0 μm.

The protection paper was the same as Example 1.

The static friction coefficient between the protection paper and the photosensitive layer was 0.74, and the static friction coefficient between the protection paper and the opposite surface was 0.64.

Example 6

The photosensitive planographic printing plate was the same as Example 1. The protection paper was the same as Example 1, except that the smoothness was controlled by 10 seconds by changing the pressing pressure in paper mills.

The static friction coefficient between the protection paper and the photosensitive layer was 0.65, and the static friction coefficient between the protection paper and the opposite surface was 0.66.

Example 7

The photosensitive planographic printing plate was the same as Example 1.

The protection paper was the same as Example 1, except that the smoothness was controlled 6 seconds by changing the pressing pressure in paper mills.

The static friction coefficient between the protection paper and the photosensitive layer was 0.64, and the static friction coefficient between the protection paper and the opposite surface was 0.67.

Comparative Example 1

The photosensitive planographic printing plate was the same as Example 1, except that the density of the convexes was 60 convexes/cm$^2$.

The protection paper was the same as Example 1.

The static friction coefficient between the protection paper and the photosensitive layer was 0.28, and the static friction coefficient between the protection paper and the opposite surface was 0.64.

Comparative Example 2

The photosensitive planographic printing plate was the same as Example 1, except that the convex of the mat layer was in a density of 150 convexes/cm² and a mean height of 1.5 μm.

The protection paper was the same as Example 1.

The static friction coefficient between the protection paper and the photosensitive layer was 0.23, and the static friction coefficient between the protection paper and the opposite surface was 0.64.

Comparative Example 3

The photosensitive planographic printing plate was the same as Example 1, except that the convexes of the mat layer was in a density of 150 convexes/cm².

The protection paper was the same as Example 1, except that 0.3 g/m² polyethylene emulsion was applied to the glossy face.

The static friction coefficient between the protection paper and the photosensitive layer was 0.26, and the static friction coefficient between the protection paper and the opposite surface was 0.64.

Comparative Example 4

The photosensitive planographic printing plate was the same as Example 1, except that the density of the convexes of the mat layer was 150 convexes/cm² and the surface roughness of the opposite face (to which 0.1 g/m² of the aforementioned photosensitive solution was applied) of 0.12.

The protection paper was the same as Example 1.

The static friction coefficient between the protection paper and the photosensitive layer was 0.40, and the static friction coefficient between the protection paper and the opposite surface was 0.28.

Comparative Example 5

The photosensitive planographic printing plate was the same as Example 1.

The protection paper was the same as Example 1, except that 0.3 g/m² polyethylene emulsion was applied to the glossy face.

The static friction coefficient between the protection paper and the photosensitive layer was 0.26, and the static friction coefficient between the protection paper and the opposite surface was 0.64.

Comparative Example 6

The photosensitive planographic printing plate was the same as Example 1, except that the density of the convexes of the mat layer was 150 convexes/cm², and the surface roughness of the opposite face (to which 0.2 g/m² of the aforementioned photosensitive solution was applied) of 0.09.

The protection paper was the same as Example 1.

The static friction coefficient between the protection paper and the photosensitive layer was 0.40, and the static friction coefficient between the protection paper and the opposite surface was 0.23.

Comparative Example 7

The photosensitive planographic printing plate was the same as Example 1.

The protection paper was the same as Example 1, except that the smoothness was 4 seconds.

The static friction coefficient between the protection paper and the photosensitive layer was 0.66, and the static friction coefficient between the protection paper and the opposite surface was 0.68.

Various properties were measured by the following methods.

Surface Roughness

Measured according to the center line average height Ra regulated in JIS B 0601 (unit: μm).

Smoothness Test

Each protection paper was cut into sheets of 50 mm×50 mm, and measured using a Bekk smoothness tester. The smoothness was the seconds necessary for passing 10 ml air through the space between 10 cm² of a glass standard face with optical surface finish and the paper surface measured by a stop watch. The measurement is described in detail in JIS P 8119.

Static Friction Coefficient

Each photosensitive planographic printing plate was cut into sheets of 150 mm×300 mm, and fixed horizontally to a smooth plate of 200 mm×350 mm facing the photosensitive layer upside. Each protection paper was cut into sheets of 100 mm×100 mm, and fixed to the smooth surface of 90 mm×90 mm of 200 g weight facing the glossy face of the protection paper outside so that both centers agreed with each other. The weight was put at the center of the smooth plate in a state that the glossy face of the protection paper was contacted with the photosensitive layer. In this state, one of the short sides of the smooth plate was raised to incline, and the inclination angle θ of the smooth plate at the beginning of slip of the weight was measured. The static friction coefficient μ was calculated by the formula μ=tan θ.

The static friction coefficient between the protection paper and the opposite face was measure in a state that both faces of the printing plate and the protection paper were reversed.

A transport slippage test and abrasion of photosensitive layer were carried out as to each examples and the results are summarized in Table 1.

TABLE 1

| | Printing Plate | | | Protection Paper | | | Static Friction Coeff. | | | Scratch of |
|---|---|---|---|---|---|---|---|---|---|---|
| | Density | Height | Surface Roughness | PE Laminate | PE Emulsion | Smoothness | Photosensitive Face | Opposite Face | Transport Slippage | Photosensitive Layer |
| Example 1 | 1000 | 4.0 | 0.25 | None | None | 60 | 0.60 | 0.64 | None | None |
| Example 2 | 150 | 4.0 | 0.25 | None | None | 60 | 0.40 | 0.64 | None | None |
| Example 3 | 1000 | 4.0 | 0.25 | Present | None | 65 | 0.70 | 0.64 | None | None |
| Example 4 | 10000 | 4.0 | 0.25 | None | None | 60 | 0.76 | 0.64 | None | None |
| Example 5 | 1000 | 6.0 | 0.25 | None | None | 60 | 0.74 | 0.64 | None | None |

TABLE 1-continued

| | Printing Plate | | | Protection Paper | | | Static Friction Coeff. | | Transport Slippage | Scratch of Photosensitive Layer |
|---|---|---|---|---|---|---|---|---|---|---|
| | Density | Height | Surface Roughness | PE Laminate | PE Emulsion | Smoothness | Photosensitive Face | Opposite Face | | |
| Example 6 | 1000 | 4.0 | 0.25 | None | None | 10 | 0.65 | 0.66 | None | None |
| Example 7 | 1000 | 4.0 | 0.25 | None | None | 6 | 0.64 | 0.67 | None | None |
| Comparative 1 | 60 | 4.0 | 0.25 | None | None | 60 | 0.28 | 0.64 | Present | None |
| Comparative 2 | 150 | 1.5 | 0.25 | None | None | 60 | 0.23 | 0.64 | Present | None |
| Comparative 3 | 150 | 4.0 | 0.25 | None | Present | 60 | 0.26 | 0.64 | Present | None |
| Comparative 4 | 150 | 4.0 | 0.12 | None | None | 60 | 0.40 | 0.28 | Present | None |
| Comparative 5 | 1000 | 4.0 | 0.25 | None | Present | 60 | 0.26 | 0.64 | Present | Present |
| Comparative 6 | 150 | 4.0 | 0.09 | None | None | 60 | 0.40 | 0.23 | Present | None |
| Comparative 7 | 1000 | 4.0 | 0.25 | None | None | 4 | 0.66 | 0.68 | None | Present |

Transport Slippage Test

Each photosensitive planographic printing plate was adhered to each protection paper by corona discharge of —8 kV. In Example 3, the polyethylene laminate face was adhered to the photosensitive layer, and in comparative Examples 3 and 5, the polyethylene emulsion coated face was adhered to the photosensitive layer. Subsequently, each one was cut into sheets of 1030 mm×800 mm, and each 50 sheets of the protection paper and the photosensitive printing plate were superposed alternately. A corrugated board pad was put on the upper end and lower end of the stack. The stack was carried on conveyors of an automatic cutting machine and an automatic packaging machine under the circumstances at 28° C. at 50% RH, and the occurrence of alippage in the stack was observed by visual observation from the start to the finish of the transport.

Scratch of Photosensitive Layer

The presence of abrasion of 0.1 mm or more in diameter was checked by visual observation after the transport.

From the above results, it can be seen that the slippage during transport does not occur by rendering the static friction between the photosensitive layer and the protection paper 0.3 or more and the static friction coefficient between the opposite face and the protection paper 0.3 or more. The slippage during transport also does not occur by forming convexes having a mean height of 2 μm or more in a density of 100 convexes/cm² or more and the mean surface roughness of the opposite face 0.15 or more. Moreover, when the smoothness of the face in contact with the photosensitive layer is 5 seconds or more, abrasion of the photosensitive layer does not occur.

It should also be understood that the foregoing relates to only a preferred embodiment of the invention, and that it is intended to cover all changes and modifications of the examples of the invention herein chosen for the purpose of the disclosure. Which do not constitute departures from the spirit and scope of the invention.

What is claimed is:

1. A package of photosensitive planographic printing plates which comprises a stack of the photosensitive planographic printing plates wherein an uncoated protection paper is interposed between each of the photosensitive planographic printing plates in the stack, wherein a mat layer comprising convexes is formed on the photosensitive layer of the photosensitive planographic printing plate, wherein both of the coefficient of static friction between the surface of the photosensitive layer and the surface of the protection paper and the coefficient of static friction between the surface opposite to the photosensitive layer of the photosensitive planographic printing plate and the surface of the protection paper are 0.3 to 0.8, the surface opposite to the photosensitive layer of the photosensitive planographic printing plate has a mean surface roughness of 0.15 or more, and the surface of the protection paper on the photosensitive layer side of the printing plate has a smoothness of 5 seconds or more, wherein the photosensitive planographic printing plate is resistant to slippage on the protection paper, and wherein the photosensitive planographic plate is resistant to abrasion on the photosensitive layer.

2. The package of claim 1 wherein the convexes have a mean diameter of 200 μm or less, a mean height of 2 to 10 μm, and a density of 100 convexes/cm² or more.

3. The package of claim 2 wherein the density of the convexes is 700 convexes/cm² or more.

4. The package of claim 1 wherein the surface opposite to the photosensitive layer has a mean roughness of 0.25 or more.

5. The package of claim 1, wherein the coefficient of static friction is from 0.5 to 0.9.

6. The package of claim 1, wherein the convexes have a mean diameter of 10 to 60 μm, a height of 3 to 8 μm and a density of 700 to 10000, the surface roughness is 0.25 or more, and the smoothness is 20 seconds or more.

7. The package of claim 1, wherein the photosensitive planographic printing plate further comprises a back coating layer formed on the side opposite to the photosensitive layer.

* * * * *